US012796376B2

(12) United States Patent
Moroishi et al.

(10) Patent No.: US 12,796,376 B2
(45) Date of Patent: Nov. 10, 2026

(54) SEMICONDUCTOR BONDING APPARATUS

(71) Applicant: Samsung Electronics Co., Ltd., Suwon-si (KR)

(72) Inventors: Fumitaka Moroishi, Yokohama (JP); Masato Kajinami, Yokohama (JP)

(73) Assignee: Samsung Electronics Co., Ltd., Suwon-si (KR)

( * ) Notice: Subject to any disclaimer, the term of this patent is extended or adjusted under 35 U.S.C. 154(b) by 82 days.

(21) Appl. No.: 18/921,378

(22) Filed: Oct. 21, 2024

(65) Prior Publication Data

US 2025/0308957 A1 Oct. 2, 2025

(30) Foreign Application Priority Data

Mar. 27, 2024 (JP) ................................ 2024-051149
May 30, 2024 (KR) ........................ 10-2024-0071026

(51) Int. Cl.
*H10P 72/00* (2026.01)
*H10P 72/78* (2026.01)

(52) U.S. Cl.
CPC ...... *H10P 72/0446* (2026.01); *H10P 72/0616* (2026.01); *H10P 72/78* (2026.01)

(58) Field of Classification Search
CPC .. H10P 72/0446; H10P 72/78; H10P 72/0616; H10W 72/0711
See application file for complete search history.

(56) References Cited

U.S. PATENT DOCUMENTS

| | | | | |
|---|---|---|---|---|
| 5,445,188 A * | 8/1995 | Bourkel | F15B 13/0433 137/625.68 |
| 6,731,371 B1 | 5/2004 | Shiraishi | |
| 7,790,507 B2 | 9/2010 | Okamoto et al. | |
| 2004/0036850 A1 * | 2/2004 | Tsukamoto | H10P 72/78 355/75 |
| 2005/0221582 A1 | 10/2005 | Lee et al. | |
| 2008/0233680 A1 * | 9/2008 | Okamoto | H10P 72/78 414/217 |
| 2015/0228612 A1 | 8/2015 | Ha et al. | |

(Continued)

FOREIGN PATENT DOCUMENTS

| | | |
|---|---|---|
| JP | 3519122 B2 | 4/2004 |
| JP | 2006-303151 A | 11/2006 |

(Continued)

*Primary Examiner* — George R Koch
(74) *Attorney, Agent, or Firm* — Fish & Richardson P.C.

(57) ABSTRACT

The semiconductor bonding apparatus includes a porous plate member including a porous material with air permeability, the porous plate member having a first surface configured to contact a semiconductor chip and a second surface being opposite to the first surface, a base member bonded to the second surface of the porous plate member and including a first space for introducing at least positive pressure into a central region of the second surface and a second space for introducing at least negative pressure into a peripheral region of the second surface, a negative pressure supply configured to supply negative pressure to the second space of the base member and absorb and hold the semiconductor chip by the porous plate member, and a positive pressure supply configured to supply positive pressure to the first space of the base member and deform the semiconductor chip into a convex shape.

20 Claims, 11 Drawing Sheets

(56) References Cited

U.S. PATENT DOCUMENTS

| | | | | |
|---|---|---|---|---|
| 2019/0080950 | A1* | 3/2019 | Meguro | H10P 72/0616 |
| 2022/0102185 | A1 | 3/2022 | Lee et al. | |
| 2023/0178394 | A1* | 6/2023 | Ishimoto | H10P 72/0442 414/751.1 |
| 2023/0369078 | A1* | 11/2023 | Ishimoto | H10P 72/0442 |

FOREIGN PATENT DOCUMENTS

| | | | | | |
|---|---|---|---|---|---|
| JP | 2008006529 | A | * | 1/2008 | |
| JP | 2019110227 | A | * | 7/2019 | H05K 13/04 |
| JP | 6990102 | B2 | | 1/2022 | |
| JP | 2022-157318 | A | | 10/2022 | |
| KR | 10-2001-0038101 | A | | 5/2001 | |
| KR | 10-2010-0006154 | A | | 1/2010 | |
| KR | 10-2231293 | B1 | | 3/2021 | |
| KR | 10-2022-0041608 | A | | 4/2022 | |

* cited by examiner

SEMICONDUCTOR BONDING APPARATUS

CROSS-REFERENCE TO RELATED APPLICATION(S)

This application claims benefit of priority to Japanese Patent Application No. 2024-051149 filed on Mar. 27, 2024 in the Japanese Intellectual Property Office and Korean Patent Application No. 10-2024-0071026 filed on May 30, 2024 in the Korean Intellectual Property Office, the disclosure of each of which is incorporated herein by reference in its entirety.

BACKGROUND

The present inventive concepts relate to semiconductor bonding apparatuses.

As thin electronic devices are required, semiconductor chips have been reduced in thickness.

In relation thereto, a bonding apparatus for bonding a thin semiconductor chip to a substrate may be used. Such a bonding apparatus may absorb and hold a semiconductor chip through a first ventilation hole formed in a peripheral region of a collet, may inject air through a second ventilation hole formed in a central region to deform a central region of the semiconductor chip into a convex shape, and may then perform bonding. According to such a configuration, the entrainment of air between the semiconductor chip and the substrate may be suppressed, and the occurrence of voids may be reduced.

However, in such bonding apparatuses, a plurality of ventilation holes may be formed on a bottom surface of the collet, and the semiconductor chip may not be uniformly pressed when the semiconductor chip is bonded to the substrate.

In addition, in such bonding apparatuses, pressure may rapidly change at a boundary between the first ventilation hole in which negative pressure is supplied to absorb and hold the semiconductor chip, and a space of a convex-shaped portion of the semiconductor chip in which positive pressure is applied by air injected through the second ventilation hole. To this end, in the bonding apparatus, a gap may occur between the first ventilation hole and the semiconductor chip, and air may flow from the space of the convex-shaped portion toward the first ventilation hole, causing vibrations of the semiconductor chip.

SUMMARY

Some example embodiments of the present inventive concepts provide a semiconductor bonding apparatuses capable of uniformly pressing a semiconductor chip to a substrate while stably absorbing and holding the semiconductor chip.

According to an example embodiment of the present inventive concepts, a semiconductor bonding apparatus may include a porous plate member including a porous material having air permeability, the porous plate member having a first surface configured to contact a semiconductor chip and a second surface being opposite to the first surface, a base member bonded to the second surface of the porous plate member, the base member including a first space configured to introduce at least positive pressure into a central region of the second surface of the porous plate member and a second space configured to introduce at least negative pressure into a peripheral region of the porous plate member, the peripheral region being outside the central region, a negative pressure supply configured to supply negative pressure to the second space of the base member such that the semiconductor chip is absorbed and held by the porous plate member, and a positive pressure supply configured to supply positive pressure to the first space of the base member such that the semiconductor chip absorbed and held by the porous plate member is deformed into a convex shape.

The positive pressure supply may include a servo valve configured to adjust the positive pressure supplied to the first space of the base member by combining positive pressure supplied from a positive pressure source and negative pressure supplied from a negative pressure source.

The base member may be on a lower portion of a case of a bonding head. The servo valve may be in or around the case of the bonding head.

The semiconductor bonding apparatus may further include a throttle valve between the servo valve and the first space.

The semiconductor bonding apparatus may further include a pressure sensor between the servo valve and the first space. An output of the pressure sensor may be feedbacked to the servo valve.

The semiconductor bonding apparatus may further include a flow rate sensor between the servo valve and the first space. An output of the flow rate sensor is feedbacked to the servo valve.

The semiconductor bonding apparatus may further include an electromagnetic valve between the servo valve and the first space, and the electromagnetic valve may be configured to switch between a first state in which the first space is connected to the servo valve and a second state in which the first space is released to an atmosphere.

The semiconductor bonding apparatus may further include a first regulator configured to adjust the positive pressure supplied from the positive pressure source, and a second regulator configured to adjust the negative pressure supplied from the negative pressure source.

The servo valve may be configured to supply negative pressure to the first space during any time other than a time period during which the semiconductor chip is being deformed into a convex shape.

The positive pressure supply may include a pump configured to supply positive pressure to the first space of the base member.

The base member may be on a lower portion of a case of a bonding head. The pump may be in or around the case of the bonding head.

The semiconductor bonding apparatus may further include a shape sensor configured to measure a shape of the semiconductor chip And feedback a measurement result thereof to the positive pressure supply.

A diameter of a hole of the porous material may be smaller than a thickness of the semiconductor chip.

According to an example embodiment of the present inventive concepts, a semiconductor bonding apparatus may include a bonding head configured to absorb and hold a semiconductor chip, a driving mechanism configured to move the bonding head in a horizontal direction, a stage configured to support a substrate on which the semiconductor chip is to be bonded, and a shape sensor configured to measure a shape of the semiconductor chip. The bonding head may include a holding portion and a head body portion, the holding portion configured to absorb and hold the semiconductor chip, the head body portion configured to supply positive pressure and negative pressure to the holding portion. The holding portion may include a base member connected to a lower portion of the head body portion, and a porous plate member bonded to a bottom surface of the base member, the porous plate member including a porous material having air permeability, the porous plate member having a first surface configured to contact the semiconductor chip.

According to an example embodiment of the present inventive concepts, a semiconductor bonding apparatus may include a porous plate member including a porous material having air permeability, the porous plate member having a first surface configured to contact a semiconductor chip and a second surface being opposite to the first surface, a base member bonded to the second surface of the porous plate member, the base member including a first space configured to introduce at least positive pressure into a central region of the second surface of the porous plate member and a second space configured to introduce at least negative pressure into a peripheral region of the second surface of the porous plate member, the peripheral region being outside the central region and a head body portion configured to supply negative pressure to the second space of the base member and positive pressure to the first space of the base member, the head body portion including a servo valve configured to adjust the positive pressure supplied to the first space of the base member.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Figure 1:
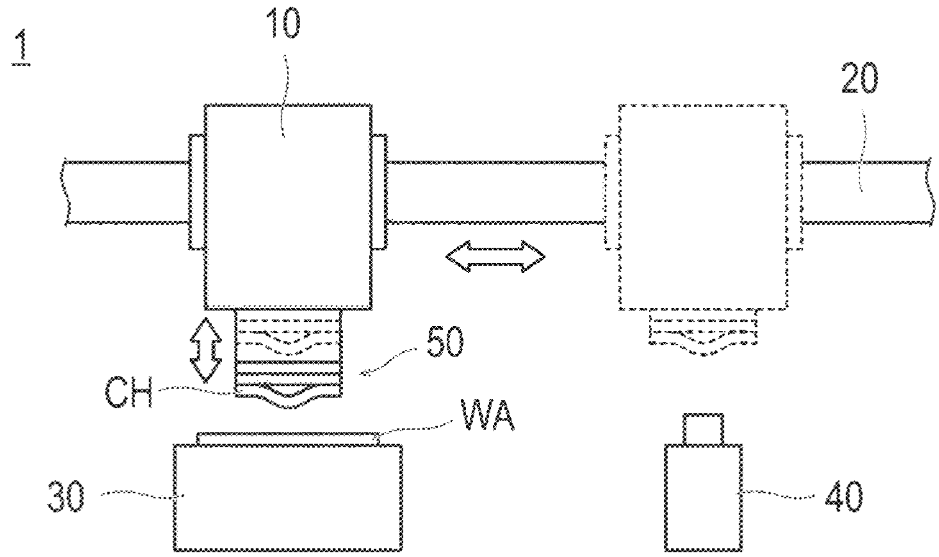
FIG. 1 is a diagram illustrating a schematic configuration of a semiconductor bonding apparatus according to an example embodiment.

Hereinafter, some example embodiments of the present disclosure are described in detail with reference to the accompanying drawings. Components denoted by the same reference numerals in the drawings may be the same components. Sizes of the components in the drawings may be exaggerated for clarity and convenience of description. The example embodiments described below are merely examples, and various modifications may be made to the disclosed example embodiments.

The term "above" or "on" may include not only "immediately on in a contact manner" but also "on in a non-contact manner." Similarly, the term "under" or "below" may include not only "immediately below in a contact manner" but also "below in a non-contact manner."

As used herein, the singular forms "a," "an," and "the" are intended to include the plural forms as well, unless the context clearly indicates otherwise. In addition, when a portion "comprises," "includes," or "has" a component, it means that the portion may include other components as well, rather than excluding other components, unless stated otherwise.

With respect to operations in a method, unless the order is explicitly stated or otherwise stated to the contrary, the operations are performed in the appropriate order. It is not necessarily limited to the order of description of the operations. All examples and example terms used herein is merely for the purpose of describing the example embodiments, and the present inventive concepts are not limited by the examples or the example terms.

As used herein, ordinal numerals such as "first" and "second" are used for convenience and do not specify any order, unless specifically stated.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the term "about," "substantially" or "approximately" is used in this specification in connection with a numerical value, it is intended that the associated numerical value includes a manufacturing or operational tolerance (e.g., ±10%) around the stated numerical value. Moreover, when the word "about," "substantially" or "approximately" is used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, a semiconductor bonding apparatus 1 according to an example embodiment of the present inventive concepts will be described with reference to FIGS. 1 to 11.

FIG. 1 is a diagram illustrating a schematic configuration of a semiconductor bonding apparatus 1 according to an example embodiment. As illustrated in FIG. 1, the semiconductor bonding apparatus 1 may include a bonding head 10, a driving mechanism 20, a stage 30, and a shape sensor 40. The bonding head 10, the driving mechanism 20, and the shape sensor 40 may be controlled by a controller, which is not illustrated. The controller may be implemented in processing circuitry such as hardware including logic circuits, a hardware/software combination such as a processor executing software, or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The bonding head 10 may absorb and hold a semiconductor chip CH. The bonding head 10 may absorb and hold the semiconductor chip CH by a holding portion 50 mounted on a lower portion of a head case. For example, the bonding head 10 may absorb and hold a peripheral region of the semiconductor chip CH by negative pressure, and may supply positive pressure to a central region of the semiconductor chip CH to deform the semiconductor chip CH into a convex shape (e.g., into a downward convex shape). The holding portion 50 may be configured to be movable in a vertical direction. A detailed configuration of the bonding head 10 will be described below.

The driving mechanism 20 may move the bonding head 10 in a horizontal direction. The driving mechanism 20 may include a drive rail and a motor, and may move the bonding head 10, between a first position in which the bonding head 10 is disposed above the stage 30 and a second position in which the bonding head 10 is disposed above the shape sensor 40.

A substrate WA to which a semiconductor chip CH is bonded may be disposed on the stage 30. In the first position, the bonding head 10 may lower the holding portion 50, absorbing and holding the semiconductor chip CH, to bond the semiconductor chip CH to the substrate WA. For example, the semiconductor chip CH, absorbed and held by the holding portion 50, in a state of being deformed into a convex shape, may be pressed against the substrate WA, and the semiconductor chip CH may be bonded to the substrate WA. The substrate WA may be provided with a bonding agent, as desired.

The shape sensor 40 may be, for example, an optical interferometer, and may measure a shape of the semiconductor chip CH. In the second position, the shape sensor 40 may measure the convex shape of the semiconductor chip CH, absorbed and held by the bonding head 10. A measurement result of the shape sensor 40 may be feedbacked to the bonding head 10, and the convex shape of the semiconductor chip CH may be adjusted based on the measurement result.

The semiconductor bonding apparatus 1 may include components other than the components described above, or may not include some components, among the components described above. For example, the semiconductor bonding apparatus 1 may not include the shape sensor 40.

Figure 2:
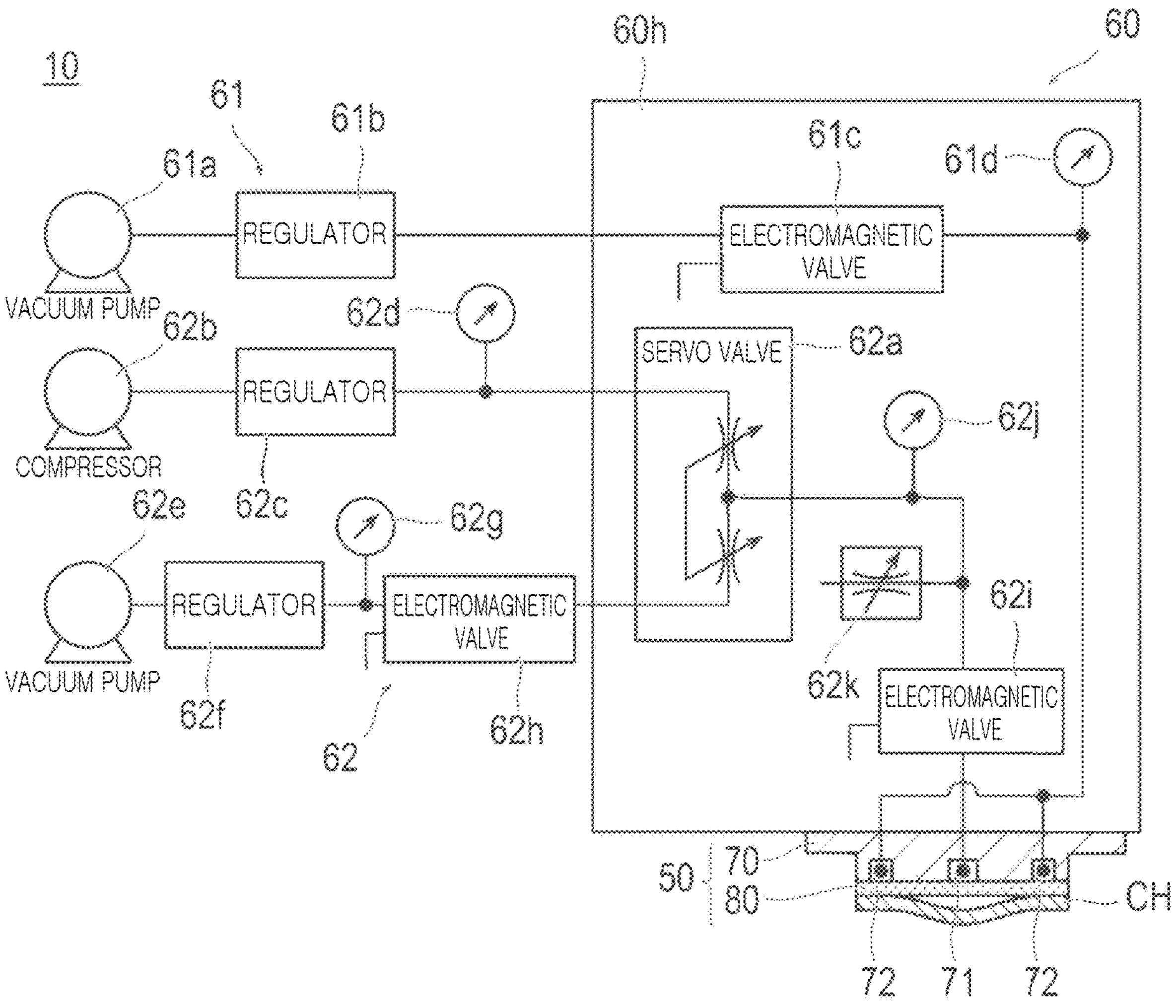
FIG. 2 is a diagram illustrating a schematic configuration of a bonding head.
Figure 3A:
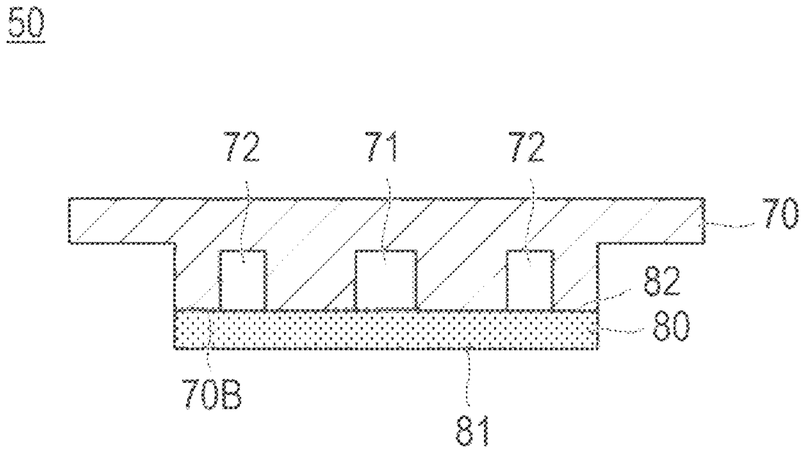
FIG. 3A is a cross-sectional view illustrating a schematic configuration of a holding portion.
Figure 3B:
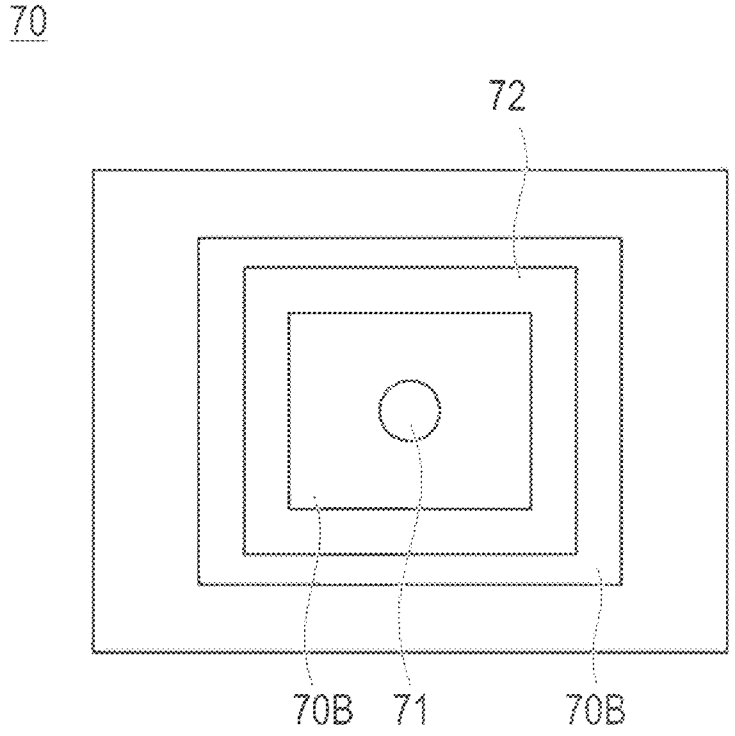
FIG. 3B is a bottom view illustrating a schematic configuration of a base member.

Hereinafter, a configuration of the bonding head 10 will be described in detail with reference to FIGS. 2 to 3B. FIG. 2 is a diagram illustrating a schematic configuration of the bonding head 10. FIG. 3A is a cross-sectional view illustrating a schematic configuration of the holding portion 50 of the bonding head 10. FIG. 3B is a bottom view illustrating a schematic configuration of a base member.

As illustrated in FIG. 2, the bonding head 10 may include a holding portion 50 absorbing and holding the semiconductor chip CH, and a head body portion 60 supplying positive pressure and negative pressure to the holding portion 50.

The holding portion 50 may include a base member 70 connected to a lower portion of the head body portion 60, and a porous plate member 80 bonded to a bottom surface 70B of the base member 70.

The base member 70 may be formed of or include a non-porous ceramic material. An upper portion of the base member 70 may be connected to a lower portion of a case 60*h* of the head body portion 60, and the bottom surface 70B of the base member 70 may be bonded to a second surface 82 of the porous plate member 80. As illustrated in FIGS. 3A and 3B, a central region of the base member 70 may have a first space 71 for introducing at least positive pressure into a central region of the second surface 82 of the porous plate member 80. A peripheral region of the base member 70 may have a second space 72 for introducing at least negative pressure into a peripheral region disposed further outwardly than the central region of the second surface 82 of the porous plate member 80. The first space 71 may be a circular ventilation hole. The second space 72 may be a rectangular ventilation groove formed to surround the first space 71. The second space 72 may be spaced apart from the first space 71, and may surround the first space 71.

The porous plate member 80 may be formed of or include a porous ceramic material having air permeability. The porous plate member 80 may have a second surface 82 bonded to the bottom surface 70B of the base member 70, and a first surface 81 in contact with the semiconductor chip CH. The porous plate member 80 may absorb and hold a peripheral region of the semiconductor chip CH by negative pressure supplied to a peripheral region of the second surface 82. In addition, the porous plate member 80 may deform a central region of the semiconductor chip CH into a convex shape by positive pressure supplied to a central region of the second surface 82. The porous plate member 80 may have a rectangular shape having a size substantially the same as that of the semiconductor chip CH.

The porous ceramic material may be formed by sintering particles of aluminum oxide or silicon carbide, and may have a ventilation hole of about 1 μm to 10 μm. A shape and dimensions (a size or a thickness) of the porous plate member 80, and a type and a size of a porous material (particle) used may be changed depending on a size or a thickness of the semiconductor chip CH.

A porous material, included in the porous plate member 80, is not limited to a ceramic material, and any porous material having air permeability may be used. For example, the porous plate member 80 may be formed of or include a porous glass material. In addition, the base member 70 may also be formed of a metal material such as an aluminum alloy or the like. A hole diameter of the porous material may be sufficiently small relative to the thickness of the semiconductor chip CH.

The head body portion 60 may include a negative pressure supply portion 61 for supplying negative pressure to the second space 72 of the base member 70, and a positive pressure supply portion 62 for supplying positive pressure to the first space 71 of the base member 70.

The negative pressure supply portion 61 may include a vacuum pump 61*a*, a regulator 61*b*, an electromagnetic valve 61*c*, and a pressure sensor 61*d*.

The vacuum pump 61*a* may be connected to the second space 72 of the base member 70 via the regulator 61*b* and the electromagnetic valve 61*c*. The pressure sensor 61*d* may be disposed between the electromagnetic valve 61*c* and the second space 72. The electromagnetic valve 61*c* and the pressure sensor 61*d* may be disposed in the case 60*h* of the head body portion 60, and the vacuum pump 61*a* and the regulator 61*b* may be disposed outside the case 60*h*.

The vacuum pump 61*a* may supply negative pressure to the second space 72 of the base member 70. The regulator 61*b* may adjust a magnitude of negative pressure supplied to the second space 72 of the base member 70. The electromagnetic valve 61*c* may switch between a first state in which the second space 72 is connected to the vacuum pump 61*a* and a second state in which the second space 72 is released to the atmosphere. When the second space 72 is in the first state, the semiconductor chip CH may be absorbed and held by the holding portion 50. When the second space 72 is in the second state, the semiconductor chip CH may be released from the holding portion 50. The pressure sensor 61*d* may be used to determine whether the holding portion 50 absorbs and holds the semiconductor chip CH.

The positive pressure supply portion 62 may include a servo valve 62*a*, a compressor 62*b*, regulators 62*c* and 62*f*, pressure sensors 62*d*, 62*g*, and 62*j*, a vacuum pump 62*e*, electromagnetic valves 62*h* and 62*i*, and a throttle valve 62*k*. The servo valve 62*a*, the pressure sensor 62*j*, the throttle valve 62*k*, and the electromagnetic valve 62*i* may be disposed in the case 60*h* of the head body portion 60. The compressor 62*b*, the regulators 62*c* and 62*f*, the pressure sensors 62*d* and 62*g*, the vacuum pump 62*e*, and the electromagnetic valve 62*h* may be disposed outside the case 60*h*.

The servo valve 62*a* may have a first side port connected to the compressor 62*b*, an exhaust port connected to the vacuum pump 62*e*, and a secondary side port connected to the first space 71 of the base member 70. The compressor 62*b* may be connected to the first side port of the servo valve 62*a* via the regulator 62*c*, and the pressure sensor 62*d* may be disposed between the regulator 62*c* and the servo valve 62*a*. The vacuum pump 62*e* may be connected to the exhaust port of the servo valve 62*a* via the regulator 62*f* and the electromagnetic valve 62*h*, and the pressure sensor 62*g* may be disposed between the regulator 62*f* and the electromagnetic valve 62*h*. The first space 71 of the base member 70 may be connected to the secondary side port of the servo valve 62*a* via the electromagnetic valve 62*i*, and the pressure sensor 62*j* and the throttle valve 62*k* may be disposed between the servo valve 62*a* and the electromagnetic valve 62*i*.

The servo valve 62*a* may be a nozzle flapper-type servo valve, and may be controlled by a controller, which is not illustrated. The servo valve 62*a* may include two variable throttle valves, and may adjust a flow rate of positive pressure supplied from the compressor 62*b* and a flow rate of negative pressure supplied from the vacuum pump 62*e* to adjust a magnitude of positive pressure supplied to the first space 71 of the base member 70.

The compressor 62*b* may be a positive pressure source, and may supply positive pressure to the servo valve 62*a*. A magnitude of positive pressure, supplied from the compressor 62*b* to the servo valve 62*a*, may be detected by the pressure sensor 62*d* and adjusted by the regulator 62*c*. The vacuum pump 62*e* may be a negative pressure source, and may supply negative pressure to the servo valve 62*a*. A magnitude of negative pressure, supplied from the vacuum pump 62*e* to the servo valve 62*a*, may be detected by the pressure sensor 62*g* and adjusted by the regulator 62*f*. The electromagnetic valve 62*h* may switch between a first state in which the exhaust port of the servo valve 62*a* is connected to the vacuum pump 62*e* and a second state in which the exhaust port of the servo valve 62*a* is released to the atmosphere.

The pressure sensor 62*j* may detect a magnitude of positive pressure supplied from the servo valve 62*a* to the first space 71 of the base member 70. An output of the pressure sensor 62*j* may be feedbacked to the servo valve 62*a*. The throttle valve 62*k* may adjust a flow rate of positive pressure supplied from the servo valve 62*a* to the first space 71 of the base member 70. The electromagnetic valve 62*i* may switch between a first state in which the first space 71 is connected to the servo valve 62*a* and a second state in which the first space 71 is released to the atmosphere.

The head body portion 60 may include components other than the components described above, or may not include some components, among the components described above. For example, the head body portion 60 may not include the electromagnetic valve 62*i* or the pressure sensor 62*j*. In some example embodiments, the head body portion 60 may include a flow rate sensor between the servo valve 62*a* and the solenoid valve 62*i*, instead of the pressure sensor 62*j*.

The negative pressure supply portion 61 may not include the vacuum pump 61*a*. In this case, negative pressure may be supplied to the second space 72 of the base member 70 from a negative pressure source such as a vacuum pump provided outside the semiconductor bonding apparatus 1. Similarly, the positive pressure supply portion 62 may not include the compressor 62*b* or the vacuum pump 62*e*. In this case, positive pressure and negative pressure may be supplied to the servo valve 62*b* from a positive pressure source and a negative pressure source provided outside the semiconductor bonding apparatus 1, respectively.

As used herein, the term "positive pressure" may refer to a pressure higher than a pressure of an environment in which the semiconductor bonding apparatus 1 is installed, and the term "negative pressure" may refer to a pressure lower than the pressure of the environment in which the semiconductor bonding apparatus 1 is installed. Accordingly, when the semiconductor bonding apparatus 1 is installed in the atmosphere, "positive pressure" may refer to a pressure higher than atmospheric pressure, and "negative pressure" may refer to a pressure lower than atmospheric pressure. In addition, when the semiconductor bonding apparatus 1 is installed in a clean room, "positive pressure" may refer to a pressure higher than a pressure in the clean room, and "negative pressure" refers to a pressure lower than the pressure in the clean room. The pressure in the clean room may be generally set to a pressure even higher than atmospheric pressure.

Similarly, the term "released to the atmosphere" may mean that a pressure of the first space 71 or the second space 72 becomes the same as the pressure of the environment in which the semiconductor bonding apparatus 1 is installed. Accordingly, when the semiconductor bonding apparatus 1 is installed in the clean room, "released to the atmosphere" may mean that the pressure of the first space 71 or the second space 72 becomes the same as the pressure in the clean room.

According to the semiconductor bonding apparatus 1 of the present example embodiment configured as described above, the semiconductor chip CH may be absorbed and held via the porous plate member 80. For example, a peripheral region of the semiconductor chip CH may be absorbed and held by negative pressure supplied to a peripheral region of the second surface 82 of the porous plate member 80. A central region of the semiconductor chip CH may be pressed against the substrate WA by positive pressure supplied to a central region of the second surface 82 of the porous plate member 80, such that the central region of the semiconductor chip CH may be deformed into a convex shape downward (e.g., into a downward convex shape).

According to the semiconductor bonding apparatus 1 of the present example embodiment, a magnitude of positive pressure for forming the convex shape of the semiconductor chip CH may be controlled by the servo valve 62*a*, such that the convex shape of the semiconductor chip CH may be controlled with a higher degree of precision. For example, micro pressure around atmospheric pressure may be controlled with a higher degree of precision by the servo valve 62*a*, and the semiconductor chip CH may be deformed into a desired convex shape while suppressing excessive stress on the semiconductor chip CH.

In the semiconductor bonding apparatus 1 of the present example embodiment, for example, a result of measurement, performed by the shape sensor 40 for the semiconductor chip CH, may be feedbacked to the servo valve 62*a*, such that the semiconductor chip CH may be deformed to a desired convex shape.

Hereinafter, an operational effect of the servo valve 62*a* will be described in detail with reference to FIG. 4.

Figure 4:
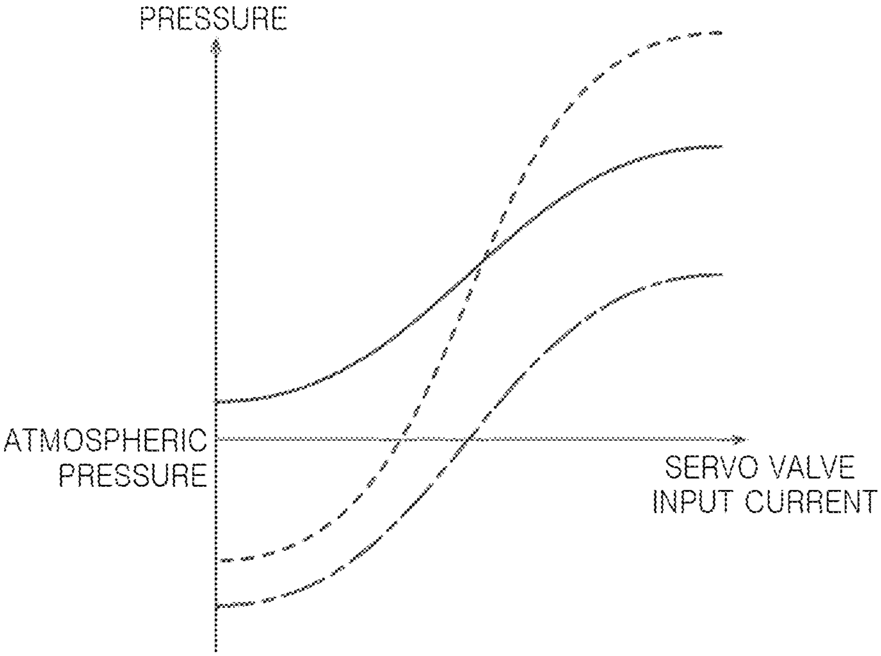
FIG. 4 is a diagram illustrating a relationship between input current in a servo valve and supply pressure.

FIG. 4 is a diagram illustrating a relationship between input current to the servo valve 62*a* and supply pressure. In FIG. 4, a horizontal axis represents input current to the servo valve 62*a*, and a vertical axis represents pressure supplied to the first space 71 of the base member 70. In FIG. 4, three types of pressure changes are represented by a solid line, a broken line, and an alternated long and short dash line.

As illustrated in FIG. 4, in the semiconductor bonding apparatus 1 of the present example embodiment, a magnitude of pressure supplied to the first space 71 of the base member 70 may vary depending on input current of the servo valve 62*a*. For example, as the input current of the servo valve 62*a* increases, the pressure supplied to the first space 71 may increase. A magnitude or a variation range of the pressure supplied to the first space 71 may vary depending on a magnitude or a flow rate of positive pressure supplied from the compressor 62*b* and a magnitude or a flow rate of negative pressure supplied from the vacuum pump 62*e*.

Accordingly, according to the semiconductor bonding apparatus 1 of the present example embodiment, positive pressure supplied to the first space 71 of the base member 70 may be controlled by the servo valve 62*a*, thereby controlling pressure with a high degree of precision in the vicinity of atmospheric pressure. Thus, the convex shape of the semiconductor chip CH may be controlled with a higher degree of precision.

In the semiconductor bonding apparatus 1 of the present example embodiment, the servo valve 62*a* may be configured to block positive pressure when power is cut off so as to mitigate or prevent the semiconductor chip CH from blowing away even when power is unintentionally cut off. In addition, in the semiconductor bonding apparatus 1 of the present example embodiment, the servo valve 62*a* may be configured to supply negative pressure to the first space 71 of the base member 70 during any time other than a time period during which the semiconductor chip CH is being deformed into a convex shape.

Hereinafter, an operational effect of the throttle valve 62*k* will be described in detail with reference to FIG. 5.

Figure 5:
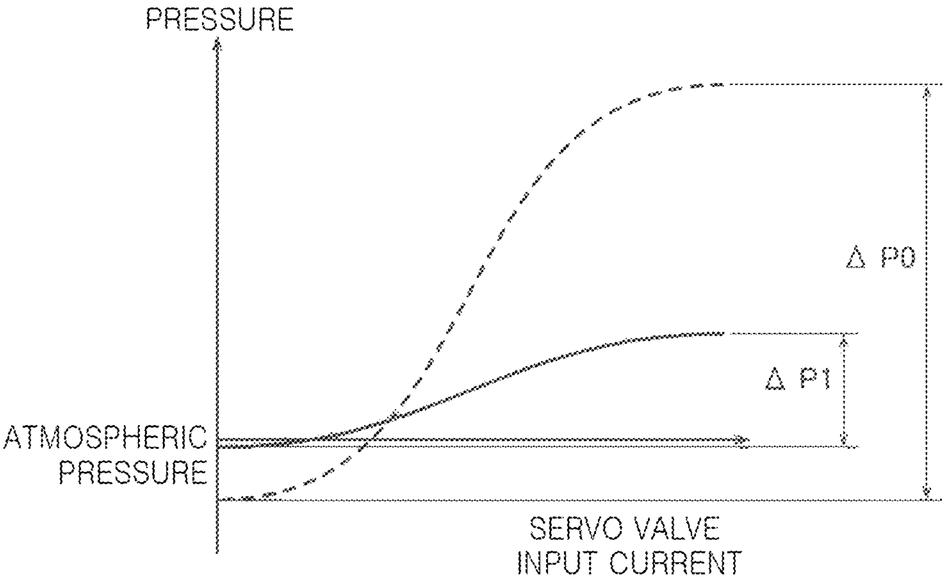
FIG. 5 is a diagram illustrating a relationship between input current in a servo valve, supply pressure, and a throttle valve.

FIG. 5 is a diagram illustrating a relationship between input current to the servo valve 62*a*, supply pressure, and the throttle valve 62*k*. In FIG. 5, a horizontal axis represents input current in the servo valve 62*a*, and a vertical axis represents pressure supplied to the first space 71 of the base member 70. In FIG. 5, a solid line represents a relationship between input current and pressure when the throttle valve 62*k* reduces a flow rate, and a broken line represents a relationship between input current and pressure when the throttle valve 62*k* does not reduce the flow rate.

As illustrated in FIG. 5, in the semiconductor bonding apparatus 1 of the present example embodiment, a variation range of pressure supplied to the first space 71 of the base member 70 may vary when the throttle valve 62*k* reduces the flow rate and when the throttle valve 62*k* does not reduce the flow rate. For example, when the throttle valve 62*k* does not reduce the flow rate, the pressure variation range may be a first range ΔP0. Conversely, when the throttle valve 62*k* reduces the flow rate, the pressure variation range may be a second range ΔP1 narrower than the first range ΔP0.

Accordingly, according to the semiconductor bonding apparatus 1 of the present example embodiment, a flow rate of gas flowing from the servo valve 62*a* toward the first space 71 may be reduced by the throttle valve 62*k*, thereby controlling pressure in a narrow variation range with a higher degree of precision. Thus, the convex shape of the semiconductor chip CH may be more precisely controlled. The throttle valve 62*k* may be a variable throttle valve or a fixed throttle valve.

Hereinafter, a pressing operation of the holding portion 50 will be described with reference to FIGS. 6A and 6B.

Figure 6A:
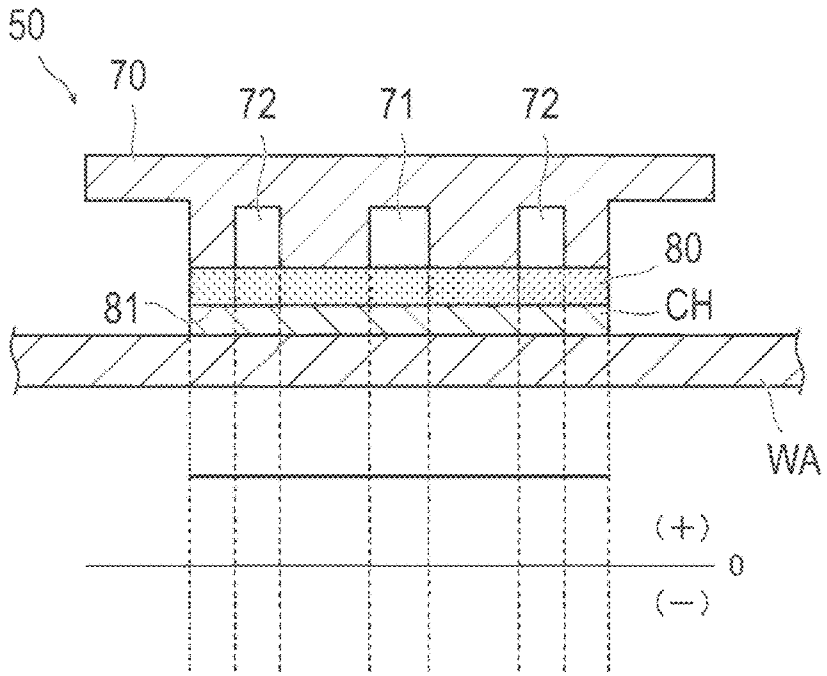
FIG. 6A is a diagram illustrating force applied to a surface of a semiconductor chip by a semiconductor bonding apparatus, according to an example embodiment.

FIG. 6A is a diagram illustrating force applied to a surface of the semiconductor chip CH by the semiconductor bonding apparatus 1 of the present example embodiment. FIG. 6B is a diagram illustrating force applied to a surface of the semiconductor chip CH by a semiconductor bonding apparatus of a comparative example, not including a porous plate member.

Figure 6B:
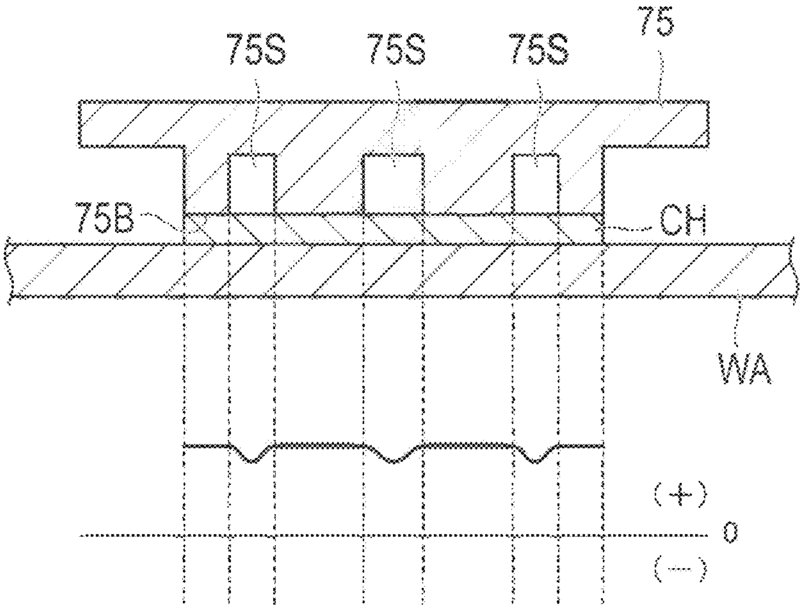
FIG. 6B is a diagram illustrating force applied to a surface of a semiconductor chip by a semiconductor bonding apparatus, according to a comparative example.

As illustrated in FIG. 6B, in the semiconductor bonding apparatus of the comparative example, the semiconductor chip CH may be pressed against the substrate WA in a state in which a bottom surface 75B of a base member (collet) 75 is in direct contact with the semiconductor chip CH. However, the bottom surface 75B of the base member 75 may have a ventilation space 75S, such that the semiconductor bonding apparatus of the comparative example may not apply a uniform force to the semiconductor chip CH. For example, in the semiconductor bonding apparatus of the comparative example, force applied to a portion of the bottom surface 75B having the ventilation space 75S may decrease as compared to a portion of the bottom surface 75B in contact with the semiconductor chip CH, and force applied to a surface of the semiconductor chip CH may become non-uniform.

As illustrated in FIG. 6A, in the semiconductor bonding apparatus 1 of the present example embodiment, the semiconductor chip CH may be pressed against the substrate WA in a state in which the first surface 81 of the porous plate member 80 is entirely in contact with the semiconductor chip CH. The first surface 81 of the porous plate member 80 may be a substantially flat surface, and may have no portion in which force is lost. According to the semiconductor bonding apparatus 1 of the present example embodiment, a uniform force may be applied to a surface of the semiconductor chip CH. Accordingly, according to the semiconductor bonding apparatus 1 of the present example embodiment, the semiconductor chip CH may have improved bonding quality.

In the semiconductor bonding apparatus of the comparative example, a width of a groove (ventilation space 75S) of the bottom surface 75B of the base member 75 may need to be sufficiently narrow relative to a thickness of the semiconductor chip CH. Accordingly, in the semiconductor bonding apparatus of the comparative example, micromachining may be desired to form a groove having a narrow width. In the semiconductor bonding apparatus 1 of the present example embodiment, the bottom surface 70B of the base member 70 may be covered by the porous plate member 80. Thus, a groove having a narrow width in the base member 70 may not be needed, and thus micromachining may be used.

In the semiconductor bonding apparatus 1 of the present example embodiment, the bottom surface 70B of the base member 70 may be covered by the porous plate member 80. Thus, an alignment mark of the semiconductor chip CH may not be dragged into the second space 72 of the base member 70. Accordingly, according to the semiconductor bonding apparatus 1 of the present example embodiment, image recognition precision of the alignment mark may be stabilized.

Hereinafter, an operational effect of the porous plate member 80 will be described with reference to FIGS. 7A to 9B.

Figure 7A:
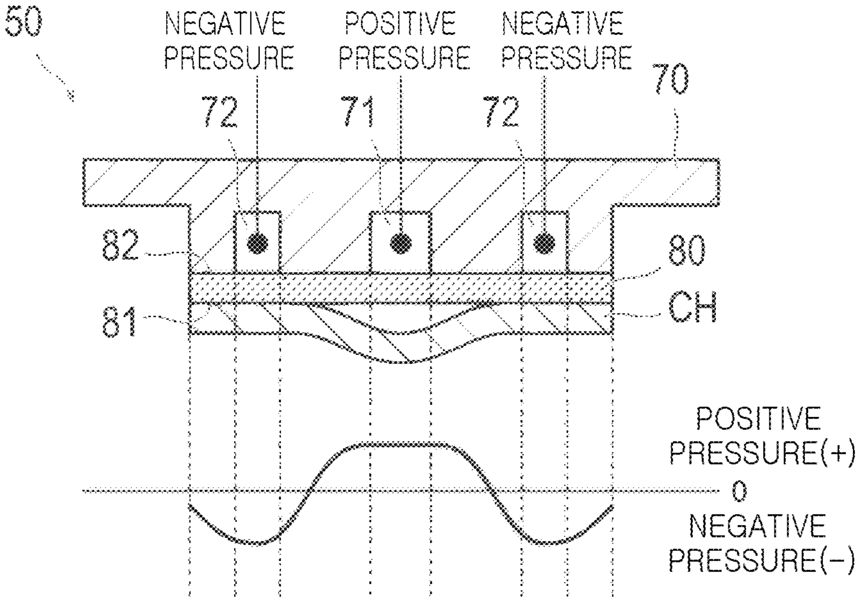
FIG. 7A is a diagram illustrating a pressure gradient on a surface of a holding portion in a semiconductor bonding apparatus, according to an example embodiment.
Figure 7B:
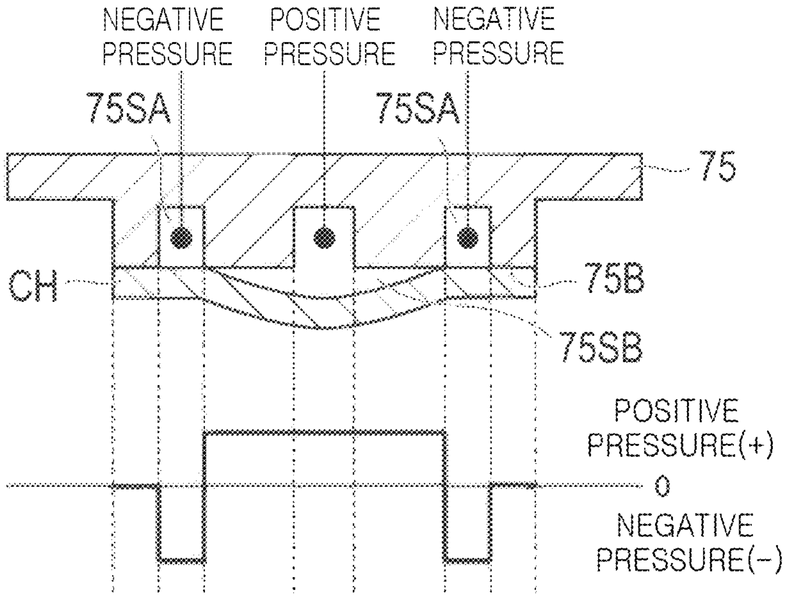
FIG. 7B is a diagram illustrating a pressure gradient on a surface of a holding portion in a semiconductor bonding apparatus, according to a comparative example.

FIG. 7A is a diagram illustrating a pressure gradient on a surface of the holding portion 50 in the semiconductor bonding apparatus 1 of the present example embodiment. FIG. 7B is a diagram illustrating a pressure gradient on a surface of a holding portion in a semiconductor bonding apparatus of a comparative example, not including a porous plate member.

Figure 8:
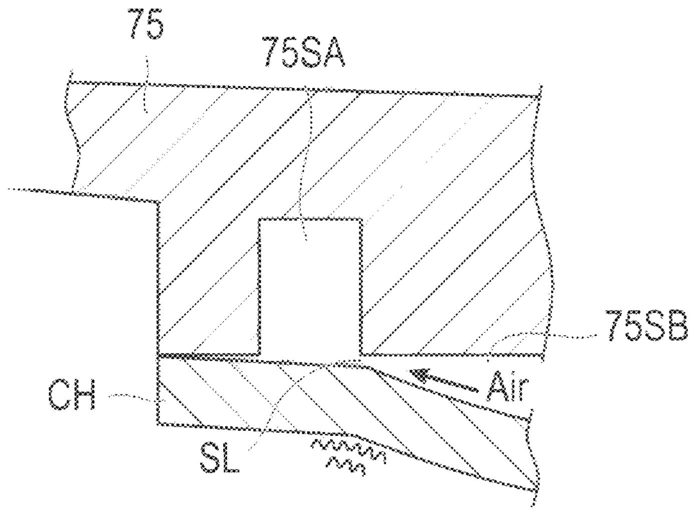
FIG. 8 is a diagram illustrating vibrations of a semiconductor chip, according to a comparative example.

As illustrated in FIG. 7B, in the semiconductor bonding apparatus of the comparative example, the base member 75 may be in direct contact with the semiconductor chip CH. Accordingly, a pressure gradient may rapidly change at a boundary between a ventilation space 75SA, which is at negative pressure, and a convex-shaped portion space 75SB, which is at positive pressure. Thus, as illustrated in FIG. 8, in the semiconductor bonding apparatus of the comparative example, a gap SL may be formed between the ventilation space 75SA and the semiconductor chip CH, and the semiconductor chip CH may be vibrated by a flow of gas from the convex-shaped portion space 75SB toward the ventilation space 75SA.

As illustrated in FIG. 7A, in the semiconductor bonding apparatus 1 of the present example embodiment, positive pressure and negative pressure supplied from the base member 70 to the second surface 82 of the porous plate member 80 may be averaged in the porous plate member 80, and thus the pressure gradient on the surface of the holding portion 50 (the first surface 81 of the porous plate member 80) may become gentle. Thus, according to the semiconductor bonding apparatus 1 of the present example embodiment, vibrations of the semiconductor chip CH, caused by sudden changes in pressure, may not occur, and the semiconductor chip CH may be stably absorbed and held.

Figure 9A:
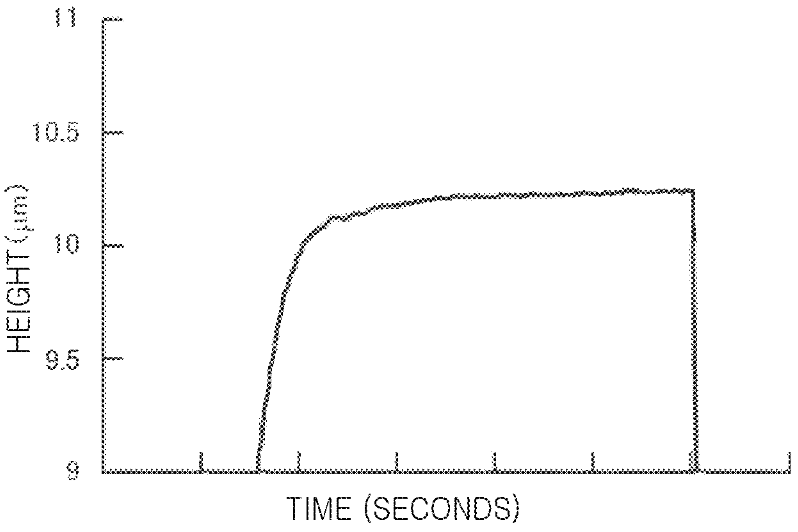
FIG. 9A is a diagram illustrating a result of measuring a vibration state of a semiconductor chip, according to an example embodiment.
Figure 9B:
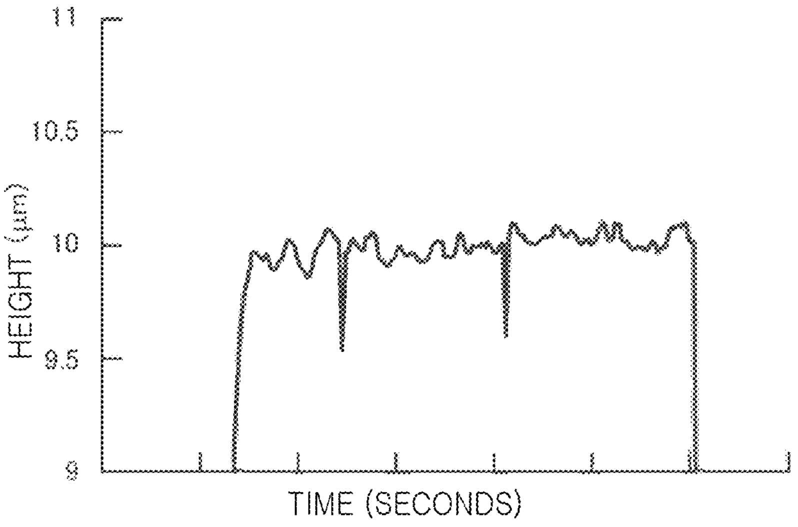
FIG. 9B is a diagram illustrating a result of measuring a vibration state of the semiconductor chip, according to a comparative example.

FIG. 9A is a diagram illustrating a result of measuring vibrations of a semiconductor chip absorbed and held by the semiconductor bonding apparatus 1 of the present example embodiment. FIG. 9B is a diagram illustrating a result of measuring vibrations of a semiconductor chip absorbed and held by a semiconductor bonding apparatus of a comparative example, not including a porous plate member. In FIGS. 9A and 9B, vibrations of the semiconductor chip were actually measured by an optical interferometer.

As illustrated in FIG. 9B, in the semiconductor bonding apparatus of the comparative example, a position (height) of the semiconductor chip in a vertical direction vertically changes over time and the semiconductor chip vibrates. As illustrated in FIG. 9A, in the semiconductor bonding apparatus 1 of the present example embodiment, a position of the semiconductor chip hardly changes, and the semiconductor chip does not vibrate.

As described above, according to the semiconductor bonding apparatus 1 of the present example embodiment, the semiconductor chip CH may be stably absorbed and held using the holding portion 50 including the base member 70 and the porous plate member 80, and the semiconductor chip CH may be uniformly pressed against the substrate WA. In addition, according to the semiconductor bonding apparatus 1 of the present example embodiment, positive pressure supplied to the first space 71 of the base member 70 may be adjusted by the servo valve 62*a*, thereby controlling a convex shape of the semiconductor chip CH with a higher degree of precision.

When a thin semiconductor chip CH is bonded, increasing an amount of convexity of the semiconductor chip CH may cause positioning precision to degrade due to stress generated in an elongation in a horizontal direction or a curved portion during bonding, and may also cause damage to the semiconductor chip. Accordingly, as the semiconductor chip CH increases in size and decreases in thickness, an amount of convexity needs to be accurately controlled. For example, pressure around atmospheric pressure may need to be accurately controlled by the servo valve 62*a*.

In addition, as described above, in the semiconductor bonding apparatus 1 of the present example embodiment, in order to deform the semiconductor chip CH into a desired convex shape, a result of measurement, performed by the shape sensor 40 for the convex shape, may be feedbacked to the servo valve 62*a*. However, unlike the present example embodiment, an output of the pressure sensor 62*j* (or a flow rate sensor) may be feedbacked to the servo valve 62*a*, instead of the measurement result of the shape sensor 40.

Instead of the servo valve 62*a*, a precision electropneumatic regulator may be used. However, for example, even when an attempt is made to transmit, to a base member, pressure around atmospheric pressure adjusted using the precision pneumatic regulator, a large pressure loss may occur due to an air transmission path at the pressure around atmospheric pressure, making it difficult or impossible to accurately transmit pressure to the base member. In addition, the precision electropneumatic regulator may have a large size, such that it may be difficult to dispose the precision electropneumatic regulator in or around the case 60*h* of the head body portion 60, and response performance may also be poor. Accordingly, the servo valve 62*a* may be used rather than the precision electropneumatic regulator.

In the above-described example embodiment, a circular ventilation hole may be formed in the bottom surface 70B of the base member 70 as the first space 71 for introducing at least positive pressure into a central region of the porous plate member 80. In addition, a rectangular ventilation groove may be formed as the second space 72 for introducing at least negative pressure into a peripheral region of the porous plate member 80. However, shapes of the first space

71 and the second space 72 are not limited to those in the above-described example embodiment.

Figure 10A:
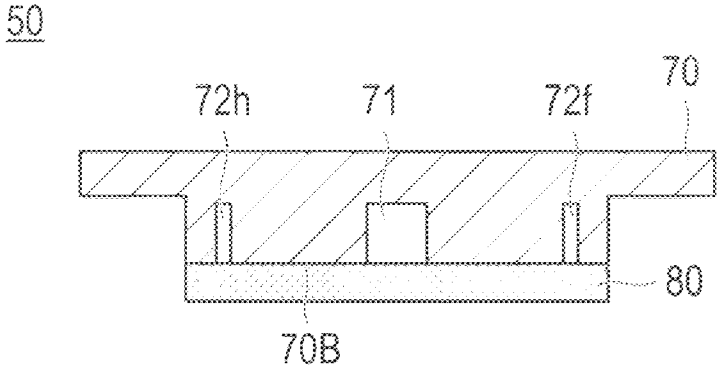
FIG. 10A is a cross-sectional view illustrating a schematic configuration of a holding portion according to an example embodiment.
Figure 10B:
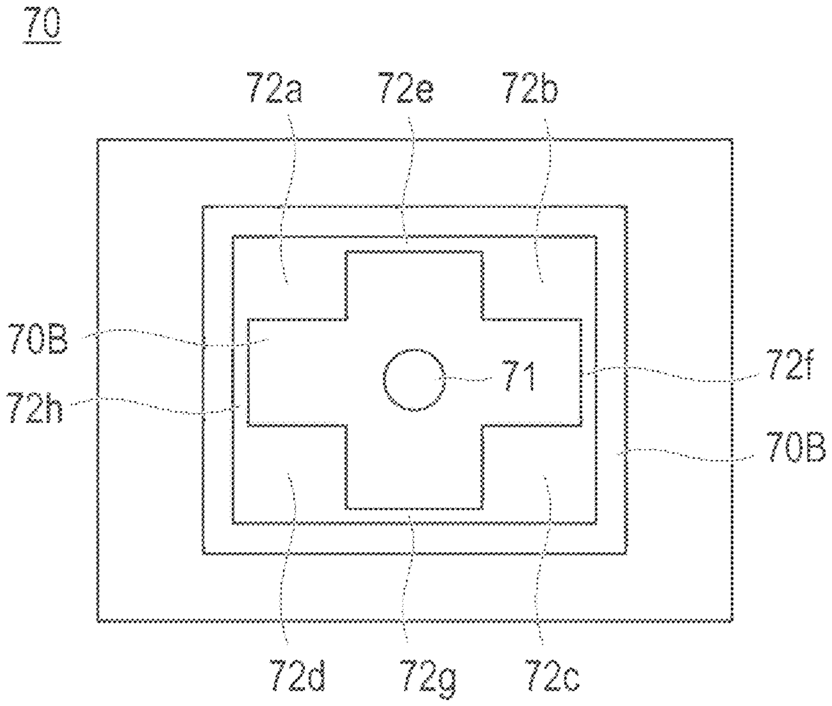
FIG. 10B is a bottom view illustrating a schematic configuration of a base member according to an example embodiment.
Figure 11A:
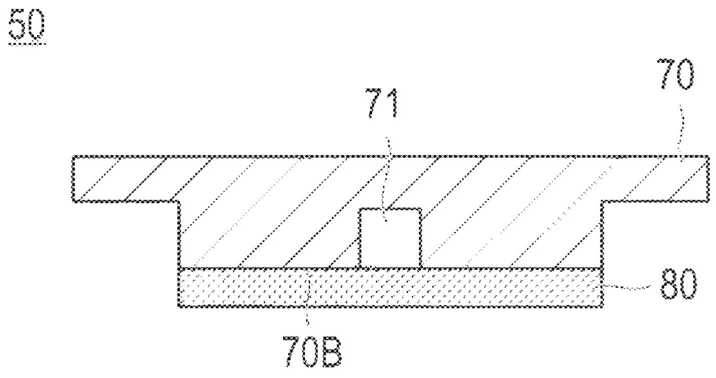
FIG. 11A is a cross-sectional view illustrating a schematic configuration of a holding portion according to an example embodiment.
Figure 11B:
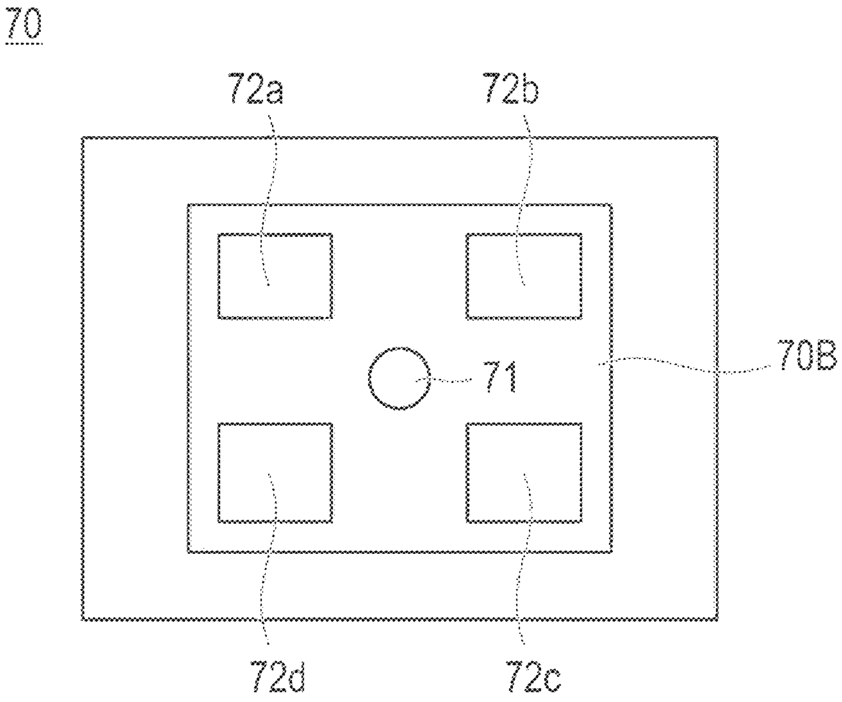
FIG. 11B is a bottom view illustrating a schematic configuration of a base member according to an example embodiment.

For example, as illustrated in FIGS. 10A and 10B, the second space 72 may be a ventilation groove having four rectangular recessed regions 72*a* to 72*d* respectively corresponding to four corners of the bottom surface 70B of the base member 70, respectively, and thin grooves 72*e* to 72*h* respectively allowing two adjacent recessed regions, among the rectangular recessed regions 72*a* to 72*d*, to communicate with each other. In some example embodiments, as illustrated in FIGS. 11A and 11B, the second space 72 may have only the four rectangular recessed regions 72*a* to 72*d*.

When an adsorption force capable of absorbing a semiconductor chip is securable, the second space may be a structure that allows gas to flow in from the outside. In addition, the first space 71 may not necessarily need to be disposed at the center of the bottom surface 70B of the base member 70. For example, the first space 71 having a circular ventilation hole may be provided to deviate from the center of the bottom surface 70B.

For example, only a ventilation hole may be formed in the base member 70, and a ventilation groove for introducing negative pressure may be formed in the second surface 82 of the porous plate member 80. In addition, for example, only a ventilation hole may be formed in the base member 70, and a ventilation groove for introducing positive pressure may be formed in the second surface 82 of the porous plate member 80.

Hereinafter, a semiconductor bonding apparatus 1 according to an example embodiment of the present inventive concepts will be described with reference to FIG. 12. The semiconductor bonding apparatus according to the present example embodiment may be different from the semiconductor bonding apparatus according to the example embodiment of FIG. 2 in that a small-sized pump is used as a positive pressure supply portion supplying positive pressure. Components the same as those in the first example embodiment are denoted by the same reference numerals, and descriptions thereof are omitted.

Figure 12:
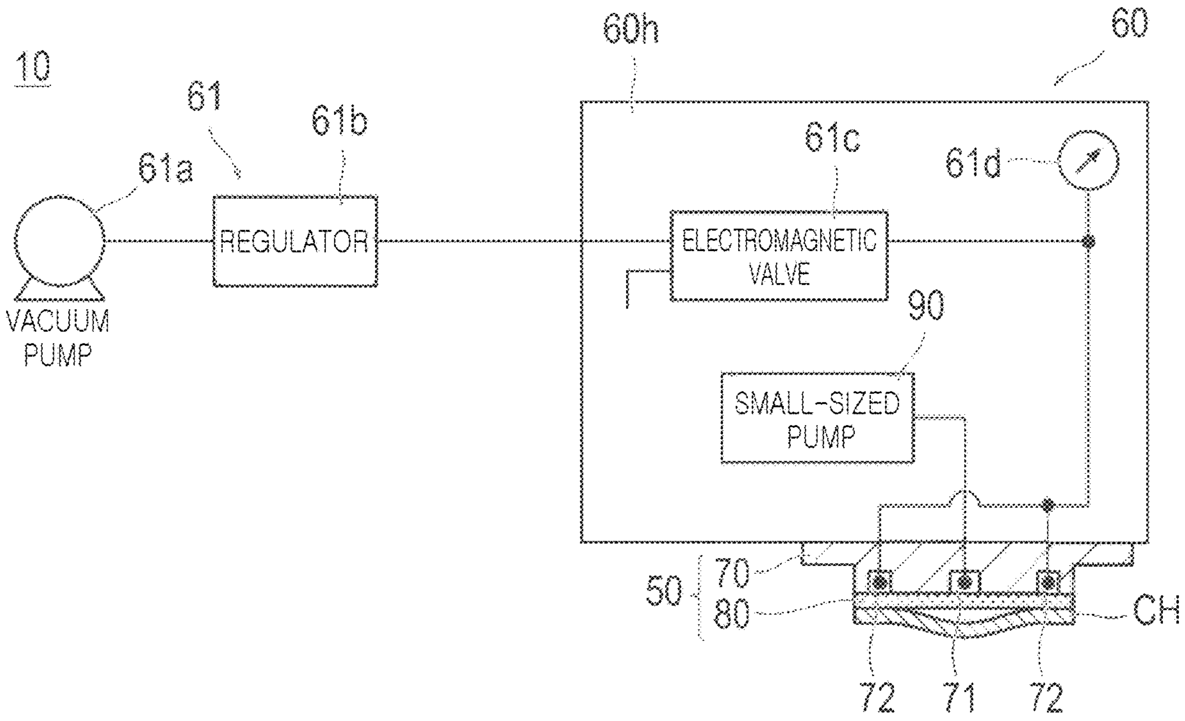
FIG. 12 is a diagram illustrating a schematic configuration of a bonding head according to an example embodiment.

FIG. 12 is a diagram illustrating a schematic configuration of the semiconductor bonding apparatus 1 according to an example embodiment. As illustrated in FIG. 12, the semiconductor bonding apparatus 1 according to the present example embodiment may include a small-sized pump 90 as a positive pressure supply portion. The small-sized pump 90 may be provided in a case 60*h* of a head body portion 60.

The small-sized pump 90 may be a piezoelectric diaphragm pump. The small-sized pump 90 may be connected to a first space 71 of a base member 70, and may supply positive pressure to the first space 71 of the base member 70.

According to the semiconductor bonding apparatus 1 of the present example embodiment configured as described above, positive pressure for forming a convex shape of a semiconductor chip CH may be controlled by the small-sized pump 90, thereby controlling the convex shape of the semiconductor chip CH at higher speed with a higher degree of precision.

A small-sized pump, such as a piezoelectric diaphragm pump, may generally have low supply pressure. Thus, the semiconductor bonding apparatus 1 according to the present example embodiment may be particularly effective for a large-sized and thin semiconductor chip CH. In addition, the small-sized pump, such as the piezoelectric diaphragm pump, generally having low flow rate, may be disposed in the case 60*h* of the head body portion 60, such that the flow rate may at least control the convex shape of the semiconductor chip CH.

The present inventive concepts are not limited to the above-described example embodiments, and may be modified in various manners within the scope of the patent claims.

For example, in the above-described example embodiments, a case in which the servo valve 62*a* or the small-sized pump 90 is disposed in the case 60*h* of the head body portion 60 has been described as an example. However, the servo valve 62*a* or the small-sized pump 90 may be disposed around the case 60*h*.

In addition, in the above-described example embodiments, a case in which an optical interferometer is used as the shape sensor 40 has been described as an example. However, the shape sensor 40 may be a line sensor or an image sensor capable of measuring the convex shape by laterally capturing an image of the semiconductor chip CH.

According to semiconductor bonding apparatuses of the present inventive concepts, a semiconductor chip may be uniformly pressed against a substrate while the semiconductor chip is stably absorbed and held.

While some example embodiments have been shown and described above, it will be apparent to those skilled in the art that modifications and variations could be made without departing from the scope of the present inventive concepts as defined by the appended claims.

What is claimed is:

1. A semiconductor bonding apparatus comprising:

a porous plate member including a porous material having air permeability, the porous plate member having a first surface configured to contact a semiconductor chip and a second surface being opposite to the first surface;

a base member bonded to the second surface of the porous plate member, the base member including a first space configured to introduce at least positive pressure into a central region of the second surface of the porous plate member and a second space configured to introduce at least negative pressure into a peripheral region of the second surface of the porous plate member, the peripheral region being outside the central region;

a negative pressure supply configured to supply negative pressure to the second space of the base member such that the semiconductor chip is absorbed and held by the porous plate member; and a positive pressure supply configured to supply positive pressure to the first space of the base member such that the semiconductor chip absorbed and held by the porous plate member is deformed into a convex shape, wherein the positive pressure supply includes a servo valve configured to adjust the positive pressure supplied to the first space of the base member, and wherein the servo valve is connected to a compressor configured to supply the positive pressure and a vacuum pump configured to supply the negative pressure, respectively.

2. The semiconductor bonding apparatus of claim 1, wherein the servo valve is configured to adjust the positive pressure supplied to the first space of the base member by combining positive pressure supplied from a positive pressure source and negative pressure supplied from a negative pressure source.

3. The semiconductor bonding apparatus of claim 2, wherein the base member is on a lower portion of a case of a bonding head, and the servo valve is in or around the case of the bonding head.

4. The semiconductor bonding apparatus of claim 2, further comprising:
a throttle valve between the servo valve and the first space.

5. The semiconductor bonding apparatus of claim 2, further comprising:
a pressure sensor between the servo valve and the first space,
wherein an output of the pressure sensor is feedbacked to the servo valve.

6. The semiconductor bonding apparatus of claim 2, further comprising:
a flow rate sensor between the servo valve and the first space,
wherein an output of the flow rate sensor is feedbacked to the servo valve.

7. The semiconductor bonding apparatus of claim 2, further comprising:
an electromagnetic valve between the servo valve and the first space, the electromagnetic valve configured to switch between a first state in which the first space is connected to the servo valve and a second state in which the first space is released to an atmosphere.

8. The semiconductor bonding apparatus of claim 2, further comprising:
a first regulator configured to adjust the positive pressure supplied from the positive pressure source; and
a second regulator configured to adjust the negative pressure supplied from the negative pressure source.

9. The semiconductor bonding apparatus of claim 2, wherein the servo valve is configured to supply negative pressure to the first space during any time other than a time period during which the semiconductor chip is being deformed into a convex shape.

10. The semiconductor bonding apparatus of claim 1, wherein
the base member is on a lower portion of a case of a bonding head, and
the vacuum pump is in or around the case of the bonding head.

11. The semiconductor bonding apparatus of claim 1, further comprising:
a shape sensor configured to measure a shape of the semiconductor chip and feedback a measurement result thereof to the positive pressure supply.

12. The semiconductor bonding apparatus of claim 1, wherein a diameter of a hole of the porous material is smaller than a thickness of the semiconductor chip.

13. A semiconductor bonding apparatus comprising:
a bonding head configured to absorb and hold a semiconductor chip;
a driving mechanism comprising a drive rail and a motor and configured to move the bonding head in a horizontal direction;
a stage configured to support a substrate on which the semiconductor chip is to be bonded; and
a shape sensor configured to measure a shape of the semiconductor chip,
wherein the bonding head includes a holding portion and a head body portion, the holding portion configured to absorb and bond the semiconductor chip, the head body portion configured to supply positive pressure and negative pressure to the holding portion,
wherein the holding portion includes a base member connected to a lower portion of the head body portion and a porous plate member bonded to a bottom surface of the base member,
wherein the porous plate member includes a porous material having air permeability and has a first surface configured to contact the semiconductor chip,
wherein the base member includes a first space and a second space on a second surface of the porous plate member, the second surface being opposite to the first surface, and
wherein a positive pressure supply is configured to adjust the positive pressure supplied to the holding portion by combining positive pressure supplied from a positive pressure source and negative pressure supplied from a negative pressure source.

14. The semiconductor bonding apparatus of claim 13, wherein the base member includes a metal material.

15. The semiconductor bonding apparatus of claim 13, wherein the porous plate member includes aluminum oxide or silicon carbide.

16. The semiconductor bonding apparatus of claim 13, wherein
the head body portion is configured to introduce positive pressure into the first space and negative pressure into the second space.

17. The semiconductor bonding apparatus of claim 16, wherein the second space is spaced apart from the first space and surrounds the first space, on the bottom surface of the base member.

18. The semiconductor bonding apparatus of claim 13, wherein
the driving mechanism is configured to move the bonding head, between a first position in which the bonding head is on the stage and a second position in which the bonding head is on the shape sensor, and
the shape sensor is configured to measure a convex shape of the semiconductor chip absorbed and held by the bonding head.

19. A semiconductor bonding apparatus comprising:
a porous plate member including a porous material having air permeability, the porous plate member having a first surface configured to contact a semiconductor chip and a second surface being opposite to the first surface;
a base member bonded to the second surface of the porous plate member, the base member including a first space configured to introduce at least positive pressure into a central region of the second surface of the porous plate member and a second space configured to introduce at least negative pressure into a peripheral region of the second surface of the porous plate member, the peripheral region being outside the central region; and
a head body portion configured to supply negative pressure to the second space of the base member and positive pressure to the first space of the base member, the head body portion including a servo valve configured to adjust the positive pressure supplied to the first space of the base member by combining positive pressure supplied from a positive pressure source and negative pressure supplied from a negative pressure source.

20. The semiconductor bonding apparatus of claim 19, wherein the positive pressure source includes a compressor configured to supply the positive pressure,
wherein the negative pressure source includes a vacuum pump configured to supply the negative pressure, and
wherein the servo valve is connected to the compressor and the vacuum pump, respectively.

* * * * *